(12) United States Patent
Maier et al.

(10) Patent No.: US 7,768,758 B2
(45) Date of Patent: Aug. 3, 2010

(54) ELECTRONIC SWITCHING DEVICE, IN PARTICULAR CIRCUIT-BREAKER AND ASSOCIATED OPERATING METHOD

(75) Inventors: Reinhard Maier, Herzogenaurach (DE); Jürgen Rupp, Erlangen (DE); Michael Schröck, Ursensollen (DE)

(73) Assignee: Siemens Aktiengesellschaft, Munich (DE)

( * ) Notice: Subject to any disclaimer, the term of this patent is extended or adjusted under 35 U.S.C. 154(b) by 794 days.

(21) Appl. No.: 11/663,818

(22) PCT Filed: Sep. 19, 2005

(86) PCT No.: PCT/EP2005/054643
§ 371 (c)(1),
(2), (4) Date: Mar. 27, 2007

(87) PCT Pub. No.: WO2006/034969
PCT Pub. Date: Apr. 6, 2006

(65) Prior Publication Data
US 2008/0048806 A1    Feb. 28, 2008

(30) Foreign Application Priority Data
Sep. 27, 2004   (DE) .................. 10 2004 046 823

(51) Int. Cl.
*H02H 3/08* (2006.01)
(52) U.S. Cl. .............................. 361/93.1; 335/6; 335/7; 335/18
(58) Field of Classification Search ................. 361/93.1, 361/100, 101, 102, 115, 93.7–93.9; 335/6, 335/7, 18
See application file for complete search history.

(56) References Cited

U.S. PATENT DOCUMENTS

| | | | |
|---|---|---|---|
| 5,216,352 A | 6/1993 | Studtmann et al. | |
| 5,596,466 A | 1/1997 | Ochi | |
| 6,178,077 B1 | 1/2001 | Kaluza et al. | |
| 6,373,318 B1* | 4/2002 | Dohnke et al. | 327/427 |
| 6,614,281 B1* | 9/2003 | Baudelot et al. | 327/321 |
| 7,206,178 B2* | 4/2007 | Friedrichs et al. | 361/93.1 |
| 2004/0027753 A1 | 2/2004 | Friedrichs et al. | |
| 2004/0047098 A1* | 3/2004 | Friedrichs et al. | 361/93.1 |

FOREIGN PATENT DOCUMENTS

| | | |
|---|---|---|
| DE | 196 00 807 A1 | 8/1996 |
| DE | 69 124 740 T2 | 2/1997 |
| DE | 196 12 216 A1 | 10/1997 |
| DE | 100 62 026 A1 | 7/2002 |

(Continued)

OTHER PUBLICATIONS

Proceedings of the Industry Applications Society Annual Metting, 4.-9.10.92, vol. 1, Seiten 1212-1217.

*Primary Examiner*—Jared J Fureman
*Assistant Examiner*—Terrence R Willoughby
(74) *Attorney, Agent, or Firm*—Harness, Dickey & Pierce, P.L.C.

(57) ABSTRACT

An anti-serial cascade circuit including two silicon carbide JFETs and two silicon MOSFETs is known. Disclosed is a combination of a JFET, a smart power MOSFET SPM and a thyristor with an associated trigger circuit, which is connected in parallel to the SPM. According to an embodiment of the invention, a logic circuit co-ordinates the functional sequence.

20 Claims, 5 Drawing Sheets

FOREIGN PATENT DOCUMENTS

| | | |
|---|---|---|
| DE | 101 47 696 A1 | 4/2003 |
| EP | 0 272 898 A | 6/1988 |
| EP | 0 620 645 A | 10/1994 |
| EP | 0 785 625 A | 7/1997 |
| WO | WO 2004/049566 A | 6/2004 |

* cited by examiner

ELECTRONIC SWITCHING DEVICE, IN PARTICULAR CIRCUIT-BREAKER AND ASSOCIATED OPERATING METHOD

PRIORITY STATEMENT

This application is the national phase under 35 U.S.C. §371 of PCT International Application No. PCT/EP2005/054643 which has an International filing date of Sep. 19, 2005, which designated the United States of America and which claims priority on German Patent Application number 10 2004 046 823.0 filed Sep. 27, 2004, the entire contents of which are hereby incorporated herein by reference.

FIELD

Embodiments of the invention generally relate to an electronic switching device, in particular a circuit breaker. In addition, embodiments of the invention also generally relate to the associated method of operation of the switching device.

BACKGROUND

Electromechanical and electronic switching devices are known to be used for switching alternating current. With electromechanical switching devices a distinction is made between switching devices for operational switching ("contactors") and for short circuit switching ("circuit breakers"). Depending on the protection concept, an overload can be switched by the circuit breaker or by the contactor.

The electronic switching devices used in practice are based on thyristor technology and are only suitable for operational switching or overload switching. In addition power semiconductors are increasingly coming into the picture: One current development known in particular is the so-called "cascode" as a combination of two antiserially switched SiC-JFETs and SI-MOSFETs.

At least one embodiment of an electronic circuit breaker is suitable for use both for operational switching on overload and also for short circuit switching. At least one embodiment of the invention combines the previous approaches of the electronic circuit breaker with newly developed functionalities.

Electronic circuit breakers must have the following functions/switching characteristics (ON, OFF):
  Undelayed ON
  If nec. phase-controlled ON
  Undelayed operational: OFF, e.g. for resistive loads
  Switching off at the zero current crossing point: operationally and on overload, especially because of switch-off or large inductances, such as of motors for example
  Cascode short circuit protection: Immediate OFF
  Overload cascode: Corresponds to the overload protection for electronic circuit breakers
  poss. overload protection branch circuit: This corresponds to overload protection for motors, leads
  Overcurrent protection for electronic circuit breakers
  Isolated activation
  Isolated status message
  Power supply at switch potential The actual circuit breaker element in this case is an antiserial cascode circuit comprising the above-mentioned combination of SiC-JFET and Si-MOSFET, which is shown in detail in FIG. 1 of the drawing and is described in detail below.

Figure 1:
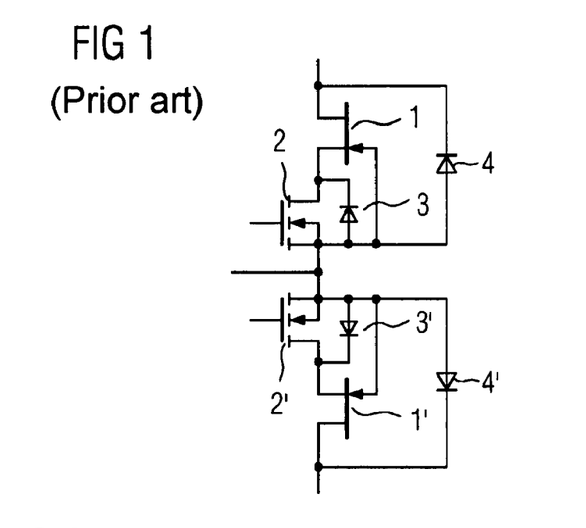

With the circuit in accordance with FIG. 1 already known from the prior art however only the functions:
  Undelayed ON and
  Undelayed OFF can be implemented. The other functions listed above cannot be realized with this circuit.

The functions "phase-controlled ON" and "overload protection: branch circuit" are able to be realized in conjunction with the other phases in a soft starter control section or an overload protection unit, protecting load (motor contactor) and operating resources such as leads for example. Such a unit is already used in soft starters with thyristors and belongs per se to the prior art.

The additional circuit in the individual phase must thus fulfill the following function in addition to "undelayed ON" and "undelayed OFF":
  Switch off at zero current crossing
  Cascode short circuit protection
  Cascode overload protection
  Overvoltage protection
  Isolated activation
  Isolated status message
  Power supply at switch potential.

Devices which thyristors—as already mentioned—are suitable as current valves. Thyristor switching devices consist of a control section at control potential and the respective circuit elements at primary voltage potential. Depending on the device, the following functions/switching attributes can be stored in the control section:
  Undelayed ON
  Phase-controlled ON (so-called "soft start")
  Operational OFF at the subsequent zero crossing by thyristors
  Overload protection for power section
  Overload protection for branch circuit
  Isolated activation
  Isolated status message, this is currently only implemented in approaches in the higher-ranking control unit.

Operational switching off at the zero crossing point and on overload is undertaken using the component characteristic of the thyristor. A short circuit on the other hand leads to the destruction of the device, if it is not protected by a higher-ranking circuit element.

Concepts are known from the prior art which describe an electronic circuit breaker, to which end the reader is referred to DE 196 12 216 A1 and U.S. Pat. No. 5,216,352 A. These concepts employ transistors.

The above-mentioned functions are achieved by individual functional units. This generally requires the instantaneous current values to be recorded, which can be done in one of the following ways:
  Current measurement: Is undertaken via converters shunts, current balancing in semiconductors.
  Switch off at zero current crossing point: Is done by evaluating the current signal by means of comparators and issuing the corresponding signal to the cascode.
  Cascode short circuit protection: "$U_{CE}$ monitoring or instantaneous current value monitoring are undertaken. This is done using known methods according to TOK (tolerant locus criterion) or the prevention of making on a short circuit by test pulse.
  Cascode overload protection: Is undertaken by delayed current evaluation/characteristic curve for short-duration overload, various heating models, temperature sensor for long-term overload protection.
  Overvoltage protection: Is undertaken using clamping, Zener diodes, varistors.
  Isolated activation, isolated status message: Is undertaken using optocouplers, transformers if nec. as IC, via R/C voltage dividers between L and N. The signal transmission is modulated onto the power supply with pulse width modulation; possibly also MR couplers.

Power supply at switch potential:

Can be undertaken transformationally from L-N or L-L using impedance/diodes from L-N or L-L, if necessary with artificial star point using R/C voltage divider between L and N, via short-duration blocked semiconductor circuit elements and capacitor charging, using current/voltage converter signal, DC/DC converter e.g. Burr Brown, AC/DC converter, e.g. transformer, ultrasound through piezo transformers, optical using optical fiber/photo cell, combination heat/thermo element.

Furthermore an electronic switching device is known from DE 100 62 026 A1 which includes a working circuit for application to the operating voltage, in which switching off means are present, which, in the event of danger, automatically bring the circuit element into the switched-off state by utilizing the energy contained in the operating current or the operating voltage. An SiC-JFET is available for this. In DE 196 00 807 A1 on the other hand, an intelligent, separate half-bridge power module is presented comprising at least one power transistor, with this being protected by an over-voltage clamping and de-saturation detection circuit. Each power transistor is assigned an isolating transformer in this invention, with its primary windings being connected to a control communication circuit isolated from it. The gate controller of the power transistor is connected in this case to the secondary winding of the transformer. Finally a monolithic current-controlled breaker system is known from DE 69 124 740 T2, in which switching off is undertaken if necessary using a suitable microprocessor control at the zero crossing point at which the energy is negligible.

Even if the above circuits are also to fulfill the functions of a circuit breaker, their design is extremely complex.

SUMMARY

At least one embodiment of the invention includes a switching device with which the functions of a circuit breaker are also fulfilled in particular.

At least one embodiment of the invention includes the specific combination of an SiC-JFET with a MOSFET embodied as a so-called SPM (Smart Power MOSFET) and a thyristor with associated control section, with the thyristor being connected in parallel to the SPM and with a separate logic circuit being present which is used for coordination of the SPM with the thyristor circuit.

BRIEF DESCRIPTION OF THE DRAWINGS

Further details and advantages of the invention emerge from the description of the figures or of example embodiments with reference to the drawings in conjunction with the claims given below. The figures show FIG. 1 the principle of an antiserial cascode circuit according to the prior art, FIG. 2 one half of a circuit arrangement with the combination of an SiC-JFET specifically with an SPM and the associated logic circuit, FIG. 3 a graph of the characteristic curves of SiC-JFET and the characteristic output curve of an SPM, FIG. 4 the program execution sequence in the logic circuit depicted in FIG. 2

DETAILED DESCRIPTION OF THE EXAMPLE EMBODIMENTS

FIG. 1 shows an antiserial cascode circuit according to the prior art. It includes two SiCJFETs 1 and 1', each of which is connected to an Si-MOSFET 2 or 2'. Thus, the elements 1, 2 and 1', 2' produce an antiserial series-connected arrangement. A blocking diode 3 or 3' is present in each case. The diode 4 or 4' handles the current in the reverse direction.

Figure 2:
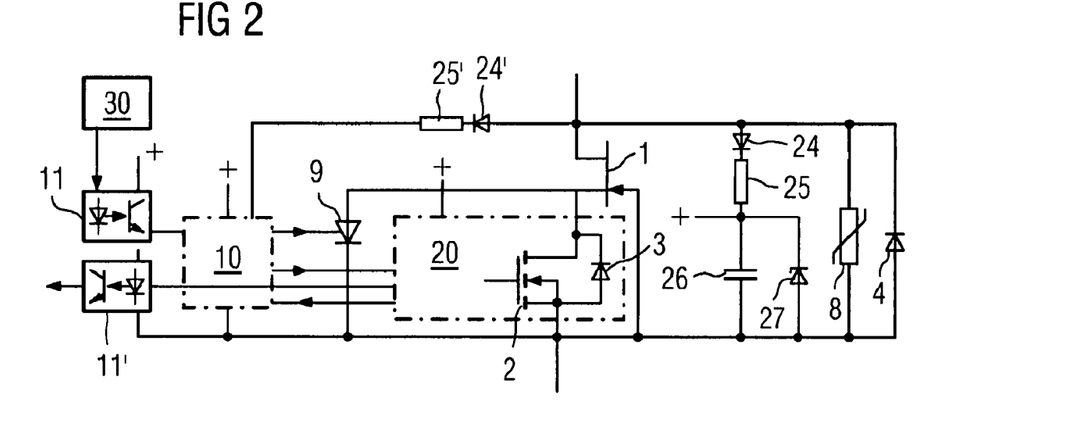

In FIG. 2 a thyristor-based soft starter control section with overload protection function is combined with a so-called SPM (Smart Power MOSFET). In this case only half of the circuit is shown in FIG. 2. The same circuit must be connected antiserially in series as shown in FIG. 1, in order in particular to produce an alternating current switch.

Specifically reference symbol 1 in FIG. 2 again refers to the SiC-JFET from FIG. 1. The overall SPM is labeled 20. Furthermore there is a thyristor 9 with an associated control section 30. The interaction of SPM 20 and thyristor 9 is guaranteed by a logic chip 10. Functions of the SPM 20 can thus be linked by software with the thyristor 9 using logic chip 10.

In FIG. 2 the current flows in the blocking direction according to FIG. 1 through the diode 4. A varistor 8 is used for overvoltage protection.

Also present in the FIG. 2 are diodes 24, 24' and resistors 25, 25', a capacitor 26 and a Zener diode 7 as voltage limiter. Such circuitry is part of the prior art.

SPMs are MOSFETs that are equipped with additional logic and mostly with a temperature and current sensor. Frequently an error state, such as for example short circuit or overload, is also output as a status message. Through the evaluation of the current signal a short circuit is either immediately switched off or the current is limited to a permissible value. Through careful matching of SiC-JFET and SPM the SiC-JFET can also be protected by the SPM against overload and short circuit.

The use of the SPM is employed on switching for undelayed ON, undelayed OFF, for short circuit protection, for current limiting and, with the aid of the integrated temperature monitoring, as overload protection of the cascode.

With a circuit arrangement according to FIG. 2 it is advantageously possible to use the control section 30 of an otherwise unchanged thyristor-based engine management device, e.g. of a so-called soft starter, largely unchanged.

Figure 3:
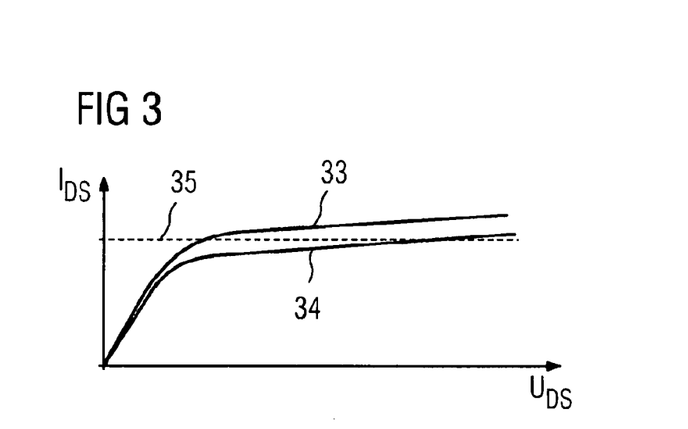

FIG. 3 shows a graph of the currents as a function of the voltage. The voltage $U_{DS}$ is plotted on the abscissa and the current $I_{DS}$ on the ordinate. 33 shows a characteristic curve of an SiC-JFETs and 34 an output curve of an SPM. Reference symbol 35 represents the protection threshold value.

In accordance with FIG. 3 the saturation current $I_{DS}$ at the SPM is smaller than at the SiC-JFET. Thus, the $U_{DS}$ voltage of the SPM, on reaching the saturation current of the SPM 20, will increase sharply, the short circuit protection or current limiting will cut in and the SiC-JFET can never get into an impermissible operating state (saturation). Likewise the temperature monitoring of the SPM can protect the SiC-JFET if the heating up of the SiC-JFET, because it has a larger heat sink for example, is lower than that of the SPM or the thermal stability of the SiC-JFET is higher than that of the SPM.

Figure 4:
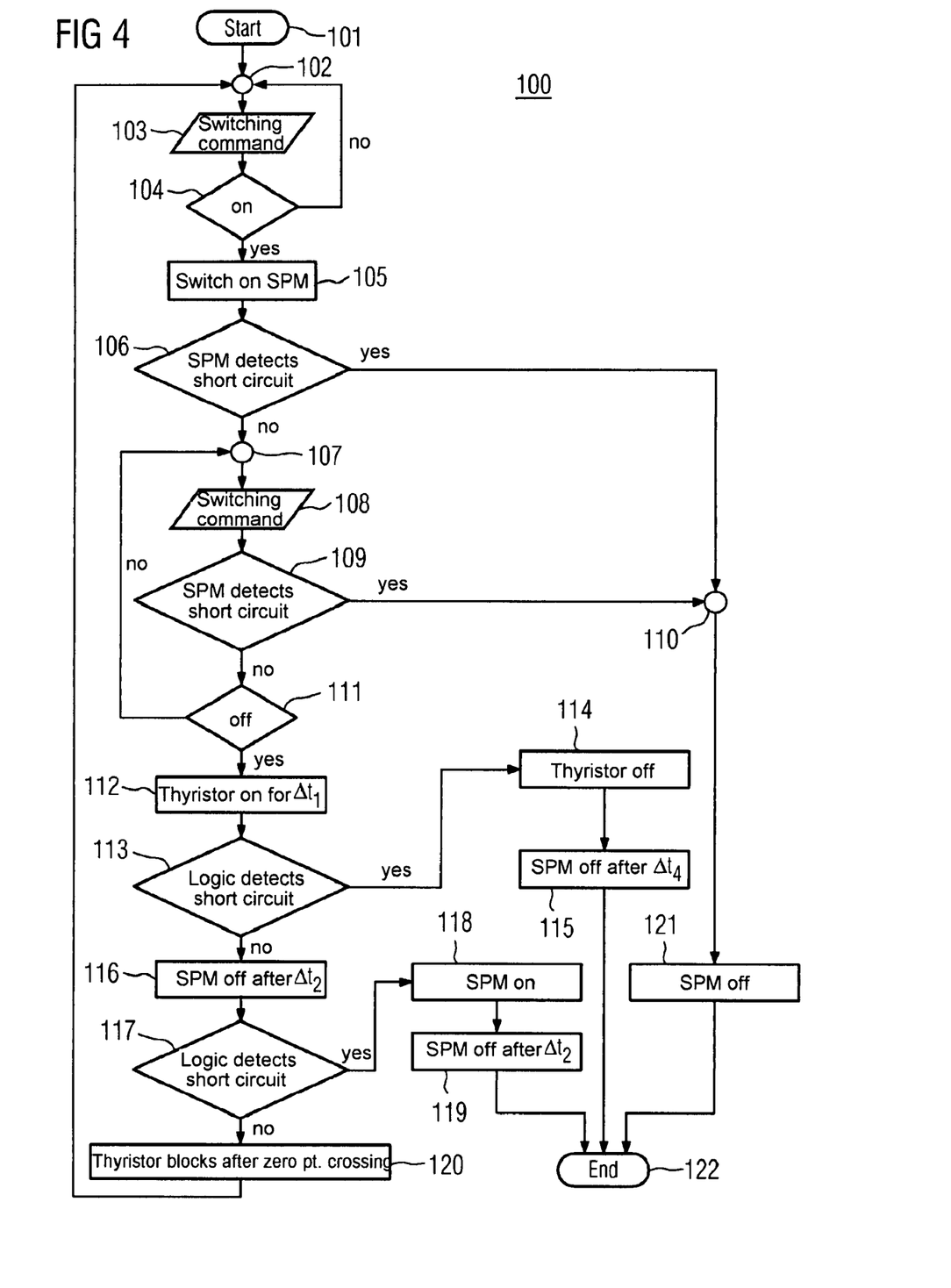

By using the thyristor 9 in parallel to the SPM 20 switching off is undertaken at the zero crossing point, with the logic circuit 10 being used for coordination of SPM 20 and thyristor 9. An execution scheme as depicted in the flowchart in FIG. 4 is implemented by software in the logic circuit or logic chip, which is described with reference to the subsequent flowchart. The structure of the flowchart is largely self-explanatory.

The switching states of the program structure 100 will now be described with reference to FIG. 4:

At position 101 a start command is issued. A connector position 102 is followed by a switching command 103 and a decision at position 104. At position 105 the SPM 20 is switched on, at position 106 a short circuit is detected. If a short circuit is detected, the decision path follows the "yes" branch and switches off the SPM 20 at position 121. There follows a connector 107 with a subsequent switching command 108 and a decision stage 109. If a short circuit is detected, the SPM is again switched off in accordance with position 121.

If no short circuit is detected, the decision branch returns from 111 to 107.

In accordance with position 112 a thyristor is switched on for time $\Delta t_1$. In position 113 the logic circuit 10 detects a short circuit. If a short circuit is present, the thyristor circuit is switched off according to position 114 and the SPM 20 is likewise switched off after an interval of time $\Delta t_4$ according to position 115.

If there is no short circuit, the SPM 20 is switched off after an interval of time $\Delta t_2$ corresponding to position 116. In the decision box labeled 117 the logic 10 detects a short circuit and switches on the SPM 20 via path c according to position 118. If there is no short circuit, the thyristor activation circuit 30 blocks according to position 120 after the zero crossing.

According to position 118 the SPM 20 is switched off after $\Delta t_3$. At point 122 the end of the program sequence is reached.

Figure 5:
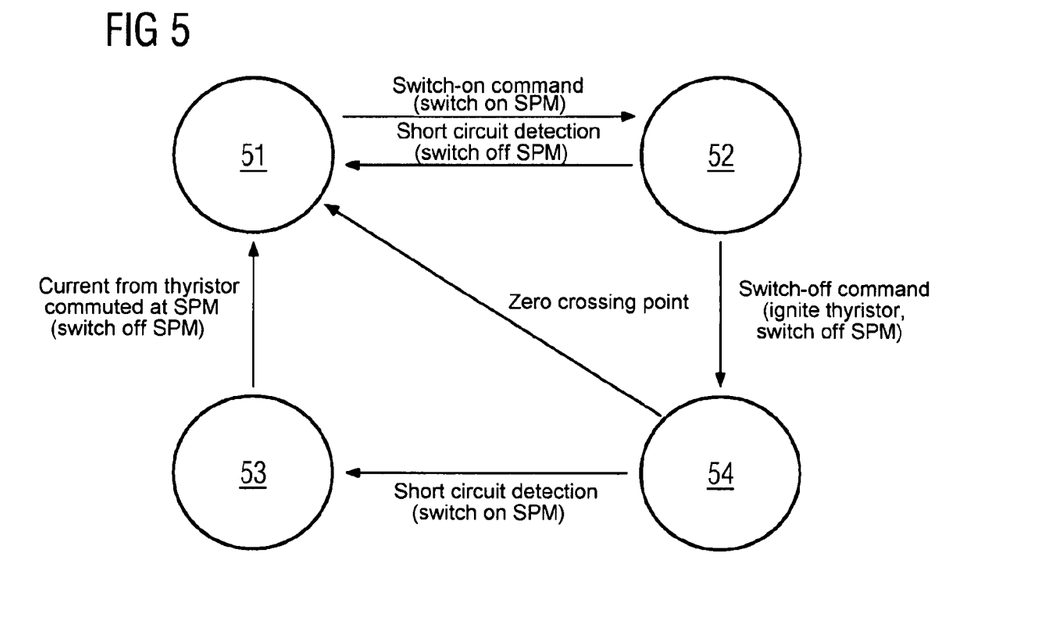
FIG. 5 the switching states of the SiC cascode with thyristor and the associated transitions, FIGS. 6 to 9 current curves of the SPM and of the thyristor for different switching states and FIG. 10 a graphical presentation of error detection.

The main functional interrelationship is illustrated in FIG. 5 on the basis of status diagrams: The switching states of the SiC cascode with SPM 20 and the thyristor 9 are depicted as circles and the associated transitions as arrows, so that the status graph illustrates the interaction thereof. Position 51 presents the open switch, i.e. here the SPM 20 and the thyristor 9 do not conduct. The circle 52 represents the closed switch. In this case the SPM 20 is closed and the thyristor 9 open. The circle 53 represents the closed switch, i.e. the SPM 20 is closed and the thyristor 9 open. Finally position 54 illustrates the operational switching off of the switch, with in this case the SPM 20 being open and the thyristor activation circuit 30 being activated.

The transitions between the four positions 51 to 54 clarify as actions the switch-on commands and the short circuit detection between the various states: For example the arrow from position 51 to position 52 reflects the switch-on command. The arrow from position 52 to position 51 reflects the short circuit detection. The arrow from position 54 to position 53 illustrates how the current commutes from thyristor 9 to the SPM 20. The arrow from position 52 to position 54 reflects the switch-off command, in which the thyristor 9 is ignited and the SPM 20 switched off. The arrow from position 54 to position 53 illustrates the short circuit detection in which the SPM 20 is switched on. Finally the arrow from position 54 to position 51 shows the switching off of the thyristor 9 at the current zero crossing point.

FIGS. 6 to 9 are used as a basis to show that the switch-on is undertaken by the SPM 20 and that in the normal state the current is fed to the SPM 20. The short circuit switch-off is undertaken in each case by the SPM 20. The thyristor is not activated in this case.

Figure 6:
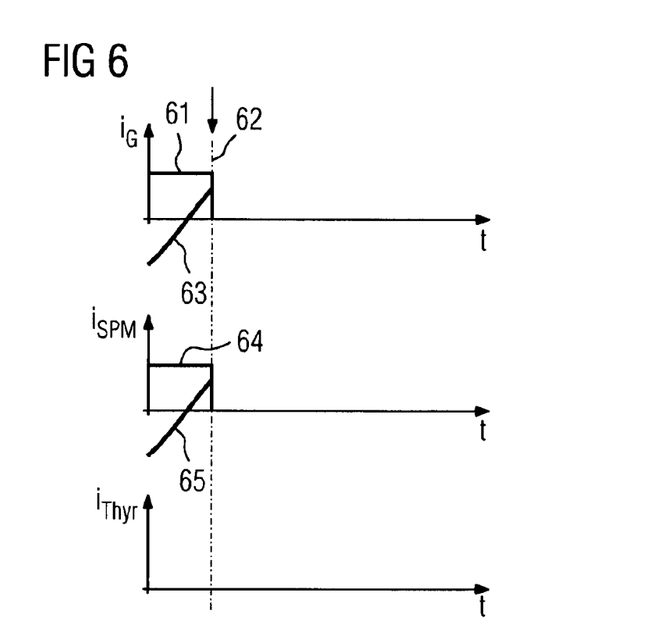

The measure short circuit switch OFF corresponding to the one path shown in FIG. 4 is illustrated in FIG. 6. Shown in the individual i(t) sub diagrams a) to c) is the activation 61 and the overall current 63 (sub diagram a), the SPM activation 64 with the SPM current 65 (sub diagram b) and the thyristor activation with the thyristor current (sub diagram c—empty). The arrow 62 specifies the point in time at which the short circuit is detected. The short circuit switch-off is undertaken by the SPM. The thyristor is not activated.

Figure 7:
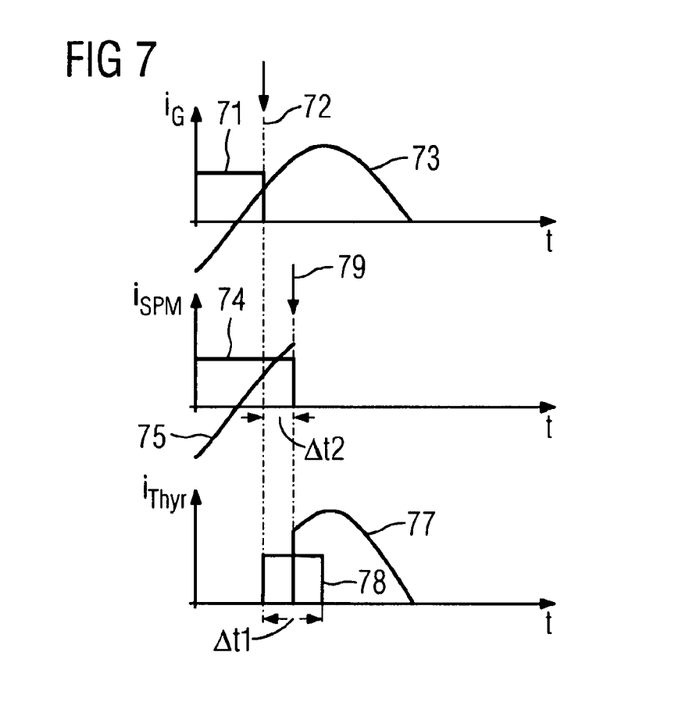

FIG. 7 illustrates the operational switching OFF, with the sub diagrams a) to c) with currents 73, 75 and 77 being structured in accordance with FIG. 6. Arrow 72 reflects the switch-off command and time arrow 79 represents the point in time of the commutation.

The switch-on is undertaken by the SPM. In the normal state the current is conducted in the SPM. The switching off at the zero crossing point for currents up to the permissible overcurrent range is undertaken by the thyristor. In this case there is first an activation of the thyristor and shortly thereafter a switch-off of the SPM. The current then extinguishes automatically at the zero crossing.

If during the switching off before the current zero crossing a short circuit occurs, the SPM does not issue any short circuit message to the chip 10. The logic receives the command for short circuit switching off via the $U_{DS}$ detection. The logic then briefly switches on the SPM. If the current is commuted at the SPM, which occurs very rapidly with the small ON resistance of the SPM, a switch-off is undertaken. The entire process takes place just a few µs. Since the SiC-JFET is very robust, it is not damaged during this time. This produces an execution sequence as depicted in FIG. 8 with the currents 83, 85 and 87 in the sub diagrams, the time arrow 81 for the switch-off command and the signal 82 for the detection of the short circuit.

Figure 9:
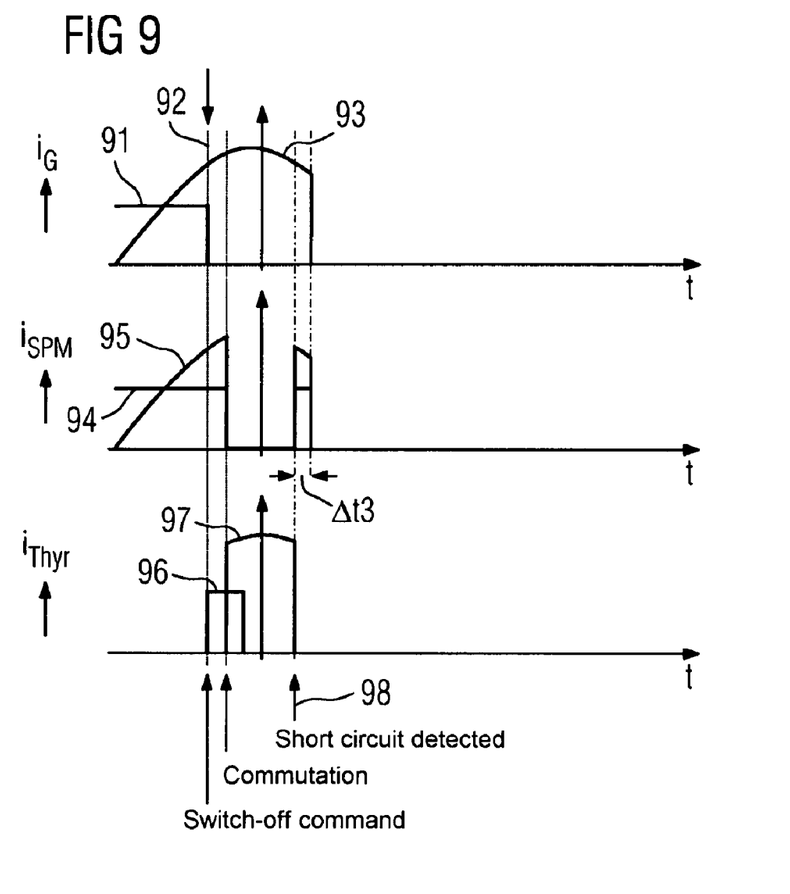

A similar situation is produced by the short circuit switching OFF, in which the thyristor 9 is activated and the SPM 20 conducts.

Figure 8:
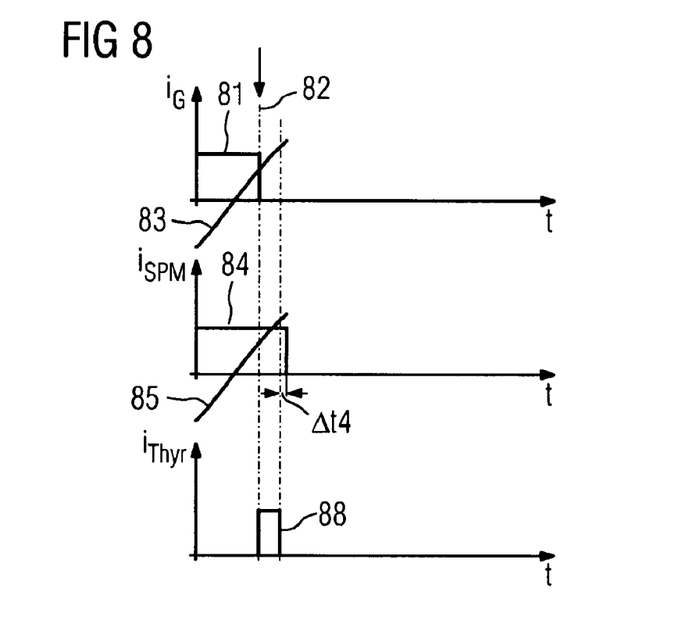

FIG. 9 shows the short circuit switching off with switched-on thyristor 9, with the individual sub diagrams a) to c) with the currents once more corresponding to the previous FIGS. 6 to 8. 91 reflects the activation, time arrow 92 the switch-off command and 93 the overall current. 94 shows the SPM activation, 95 the SPM current, 96 the thyristor activation and 97 the thyristor current after the thyristor activation 96. At time arrow 98 the short circuit is detected.

Overall an isolated activation of the units by an optocoupler 11, 11' and an overvoltage protection by the varistor 8 is produced. Optocoupler 11, 11' and varistor 8 are depicted as individual units in FIG. 2 described above. A temperature measurement can furthermore be provided, this being used for thermal overload protection.

Figure 10:
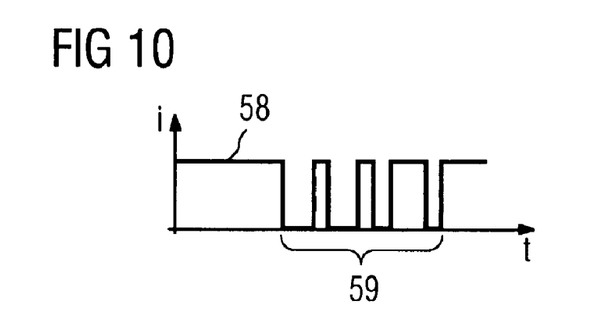

FIG. 10 shows how the status message can transmit even complex error states via the optocouplers 11, 11'. If no error occurs, the output signal 58 is HIGH ("life zero"), on occurrence of an error, this is indicated by the falling edge. The subsequent bit pattern 59 identifies the error type.

In FIG. 2 the power is supplied at switch potential with a known power supply (diode 24, 24', resistor 25, 25', capacitor 26, Zener diode 27 from FIG. 2) from the mains voltage. In this case it is necessary—even if the electronic circuit breaker is to conduct permanently—for a minimum ignition angle, during which the switch is non-conductive, to be present, to guarantee that the capacitor is charged up.

With alternative circuit variants circuits can also be used in which, instead of the use of a varistor, what is known as "clamping" over the entire SPM 20 is undertaken, which is especially possible, if the gate terminal is accessible.

An arrangement In accordance with FIG. 2 and the software implementation of the logic circuit 10 produces the following overall advantages:

The switch OFF occurs without delay if there is a short circuit: The SPM means that no discrete circuit is necessary. The coordination with the short circuit protection of the SPM means that no separate protection is necessary.

The switch-off with operational and overload currents occurs at the current zero crossing point. The use of a thyristor 9 means that an expensive comparator circuit with separate current measurement is not necessary. The overload protection is undertaken via the cascode. Coordination with the overload protection of the SPM again means that no separate protection is necessary for the SiC-JFET.

In FIG. 2 the activation circuit 30 can be used more or less unchanged as a control section of a known soft starter. An isolated activation and furthermore an isolated status message are produced. The power supply is at switch potential.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. Electronic switching device, comprising:
    means for an undelayed switch-on;
    means for an undelayed operational switch-off at the zero crossing point of the current, both during operation and on overload;
    means for an immediate switch-off as a short-circuit protection, with overload protection;
    means for an isolated activation, an isolated status message and a power supply at switch potential;
    an SiC-JFET with a MOSFET embodied as an SPM (Smart Power MOSFET); and
        at least one thyristor, the thyristor being switched in parallel with the SPM and with the combination of SiC-JFET and SPM with parallel switched thyristor being assigned a logic circuit.

2. The electronic switching device as claimed in claim 1, wherein a potential-decoupled activation unit is assigned to the at least one thyristor.

3. The electronic switching device as claimed in claim 1, functions phase-controlled switch-on and overload protection/branch are implemented in conjunction with the other phases in the thyristor activation circuit.

4. The electronic switching device as claimed in claim 2, wherein the thyristor activation circuit implements an overload protection unit.

5. The electronic switching device as claimed in claim 1, wherein the SPM brings about short-circuit protection, current limiting and overload protection for undelayed switching on, undelayed switching off.

6. The electronic switching device as claimed in claim 5, wherein the combination of the SiC-JFET with the MOSFET embodied as SPM includes an activation circuit and the associated logic circuit, wherein at least one thyristor for switching off at the zero current crossing point is present in parallel with the SPM and wherein the logic circuit is used for coordination of the SPM and the at least one thyristor.

7. The electronic switching device as claimed in claim 1, further comprising means for potential isolation.

8. The electronic switching device as claimed in claim 1, further comprising means for overvoltage protection.

9. The electronic switching device as claimed in claim 1, further comprising means for temperature measuring and for thermal overload protection.

10. Method of operation of an electronic switching device as claimed in claim 5 wherein the states are interrogated in a logical sequence and, depending on the result, at least one of the SPM and the thyristor/activation circuit are activated.

11. The method of operation as claimed in claim 10, wherein first the SPM, and subsequently the thyristor activation circuit cut in.

12. The method of operation as claimed in claim 10, wherein the logical sequence is undertaken using software.

13. The method of operation as claimed in claim 10, wherein a logic circuit with scheduling is used.

14. Electronic switching device, comprising:
    an SiC-JFET with a MOSFET embodied as an SPM (Smart Power MOSFET); and
        at least one thyristor, the thyristor being switched in parallel with the SPM and with the combination of SiC-JFET and SPM with parallel switched thyristor being assigned a logic circuit.

15. The electronic switching device as claimed in claim 14, wherein a potential-decoupled activation unit is assigned to the at least one thyristor.

16. The electronic switching device as claimed in claim 14, functions phase-controlled switch-on and overload protection/branch are implemented in conjunction with the other phases in the thyristor activation circuit.

17. The electronic switching device as claimed in claim 14, wherein the SPM brings about short-circuit protection, current limiting and overload protection for undelayed switching on, undelayed switching off.

18. The electronic switching device as claimed in claim 17, wherein the combination of the SiC-JFET with the MOSFET embodied as SPM includes an activation circuit and the associated logic circuit, wherein at least one thyristor for switching off at the zero current crossing point is present in parallel with the SPM and wherein the logic circuit is used for coordination of the SPM and the at least one thyristor.

19. Electronic switching device for at least one of an undelayed switch-on; an undelayed operational switch-off at the zero crossing point of the current, both during operation and on overload; an immediate switch-off as a short-circuit protection, with overload protection; and an isolated activation, an isolated status message and a power supply at switch potential, the electronic switching device comprising:
    an SiC-JFET with a MOSFET embodied as an SPM (Smart Power MOSFET); and
        at least one thyristor, the thyristor being switched in parallel with the SPM and with the combination of SiC-JFET and SPM with parallel switched thyristor being assigned a logic circuit.

20. The electronic switching device as claimed in claim 19, wherein a potential-decoupled activation unit is assigned to the at least one thyristor.

* * * * *